United States Patent [19]

Cleveland

[11] Patent Number: 4,901,035

[45] Date of Patent: Feb. 13, 1990

[54] PHASE-LOCKED LOOP CONTROL FOR READING DATA OFF STORAGE MEDIA

[75] Inventor: Brian G. Cleveland, Boulder, Colo.

[73] Assignee: Aspen Peripherals Corp., Longmont, Colo.

[21] Appl. No.: 183,843

[22] Filed: Apr. 20, 1988

[51] Int. Cl.⁴ .............................................. H03L 7/14
[52] U.S. Cl. ...................................... 331/14; 331/25; 360/51
[58] Field of Search ..................... 331/1 A, 14, 17, 25; 360/38.1, 51

[56] References Cited

U.S. PATENT DOCUMENTS

| | | | |
|---|---|---|---|
| 4,068,198 | 1/1978 | Otto | 332/19 |
| 4,135,163 | 1/1979 | Kosel | 331/1 A |
| 4,360,781 | 11/1982 | Sochor | 331/17 X |
| 4,583,053 | 4/1986 | Yarborough, Jr. | 331/1 A |

Primary Examiner—Siegfried H. Grimm
Attorney, Agent, or Firm—Dorr, Carson, Sloan & Peterson

[57] ABSTRACT

An improved phase-locked loop control having a phase detector receptive of a data preamble of all "ones" from a storage sub-system for producing early and late signals to a voltage controlled oscillator in order for the frequency of the oscillator to be synchronized with the frequency of the data. A pattern detector senses the incoming preamble pulses and prevents the generation of the early and late signals when a preamble pulse is not present within a predetermined window of time.

5 Claims, 3 Drawing Sheets

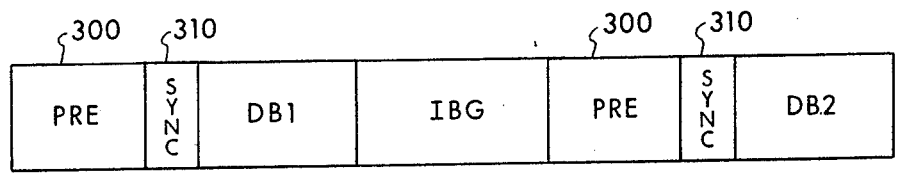
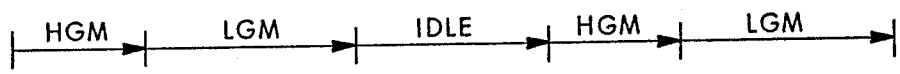
Fig. 3
(Prior Art)
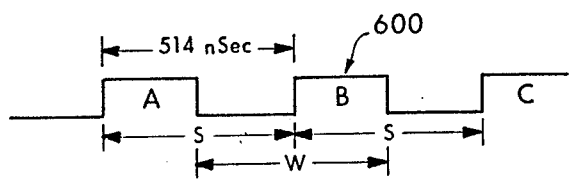
Fig. 5
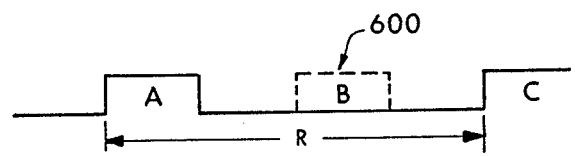
Fig. 6
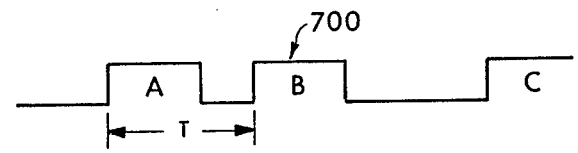
Fig. 7

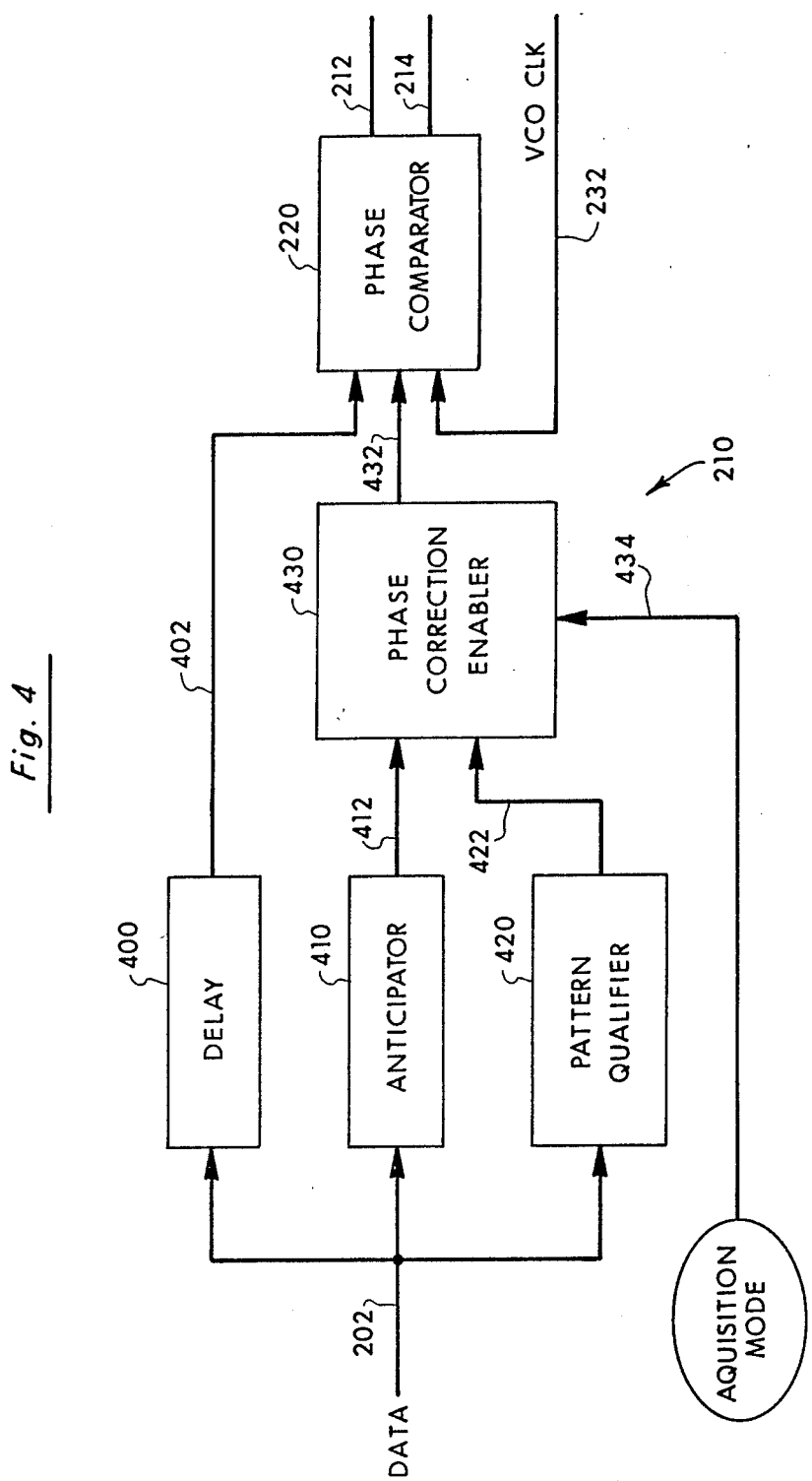

PHASE-LOCKED LOOP CONTROL FOR READING DATA OFF STORAGE MEDIA

BACKGROUND OF THE INVENTION

1. Field of the Invention

This invention relates to phase-locked loop controls for reading data from storage media and, in particular, to phase-locked loop controls for reading data off of high density media such as the IBM 3480 cartridge storage system.

2. Discussion of Prior Art

It is conventional in high performance disk, tape or optical products to employ a phase-locked loop (PLL) in the read channels. Phase-locked loop control functions to track speed variations of the incoming data read from the media.

An example of a conventional tape product that incorporates a phase-locked loop (PLL) control is shown in FIG. 1. In FIG. 1, a storage media 10 such as the IBM 3480 cartridge is read by a tape head 20 which delivers output signals through an automatic gain control circuit 30. The signals from the automatic gain control circuit 30 enter a filter and equalizer circuit 40 which filters the signal and provides equalization thereto. The signals are then delivered to a peak detector 50 which for every peak delivers a digital value representing a "one" that was previously written on the media. The peak detector then delivers the signal to a conventional phase-locked loop circuit 60 which, as mentioned, tracks speed variations in the incoming data on storage media 10. The data from the phase-locked loop 60 is delivered to a conventional data separator and error correction circuit for delivery as digital bytes of data information 90 into the system.

In FIG. 2, the phase-locked loop circuit 60 is shown to include a data selector which obtains the incoming data from the peak detector 50. The data selector circuit 200 is conventional. The output of the data selector is delivered into the phase detector 210. Phase detector 210 compares the incoming signal on line 202 to an internal clock and if there is any difference between the phase of the clock and the phase of the data on line 202, a charge pump 220 is selectively activated. For example, if the data pulse precedes the clock pulse, this is an early phase error and lead 212 becomes activated to cause the charge pump circuit 220 to deliver more current into the filter 225 which is converted to a voltage. This causes the voltage controlled oscillator 230 to increase frequency in order to obtain a phase match. Likewise, if the data on lead 202 follows the clock pulse, a late signal is delivered over lead 214 to the charge pump 220 to cause the frequency of the voltage control oscillator 230 to slow down. In a predetermined number of clock cycles, the phase-locked loop circuit 60 is in synchronism with the data. An example of a prior art phase-locked loop approach is found in U.S. Pat. No. 4,068,198.

Variations in the frequency of the signal on lead 202 can be due to a number of things including defects in the media which could cause dropouts or missing pulses, speed variations, and head flying irregularities. The oscillator 230 is typically a 1.95 MHz clock for the 3480 environment.

In FIG. 3, the prior art data format for the IBM 3480 high density tape storage sub-system is set forth showing a preamble field 300 comprising nine to thirteen frames of all "ones." Following the preamble field is a synchronization (SYNC) field 310 which normally is two frames which precedes a variable length data field DB1 and DB2. Other special purpose frames are not shown.

The phase-locked loop 60 operates in a high gain mode (HGM) during the preamble frames 300. During this mode of operation, the phase detector 210 matches the phase for each "one" read in the preamble. In the high gain mode, the phase-locked loop control 60 synchronizes the oscillator 230 with the frequency of the incoming data within two to five frames. After seven frames of the preamble frames 300, the phase-locked loop 60 enters the low gain mode (LGM) which provides phase comparisons only on the edges of data "ones".

Proper synchronization based upon acquisitions of the preamble are not always successful. For example, defects in the magnetic media can obscure the data. Tape drives may also exhibit varying degrees of skew across the head so that the preamble is not aligning with all tracks simultaneously. Furthermore, the tape could also flutter across the head and thereby obscure the data. During the inter block gap (IBG), the phase-locked loop control 60 is idle.

Problem — The problem with prior phase-locked loop controls 60 occurs if errors occur in the preamble field 300. If any of the "ones" are actually zeros, an error occurs, and as mentioned, this may be due to a number of factors. The presence of errors in the preamble field causes problems with the phase detector 210 in properly matching the phase of the voltage controlled oscillator 230 with the incoming data. For example, a missing pulse would cause a substantial late error signal on lead 214 causing the VCO 230 to slow down. Several missing pulses in a row would clearly put the VCO 230 out of lock with the incoming data.

If there is corruption in the preamble, the phase-locked loop comparisons will continue with the voltage controlled oscillator becoming out of lock. For example, if data pulses are missing in the preamble, the voltage controlled oscillator will incorrectly slow to what it determines to be a much slower frequency of the preamble data. Even if the corruption goes away in the preamble and correct data returns, the phase-locked loop control may not have enough time to acquire the proper frequency of the incoming data thus lowering the probability of accurate acquisition.

Solution — The present invention provides a solution to this problem to better insure the integrity of operation of the phase-locked loop control 60.

The present invention adds a new circuit, a pattern qualifier, to overcome the above problem and to achieve a better probability of acquisition. The present invention is designed to check the preamble data for proper bit spacing and if missing or extra pulses are present, the pattern qualifier disables a phase comparison from taking place. Thus the voltage controlled oscillator frequency remains constant during the periods of corruption until the proper bit spacing returns to the preamble. Hence, during the periods of corrupt data, the phase-locked loop control as modified by the teachings of the present invention will not attempt to find a new and incorrect frequency as would occur under the prior art approaches.

SUMMARY OF THE INVENTION

The present invention is a phase-locked loop control having a phase detector receptive of the data preamble of all "ones" from a storage subsystem for producing early and late signals to a voltage controlled oscillator in order for the frequency of the oscillator to be synchronized with the frequency of the data. In the phase-locked loop control of the present invention, a novel pattern qualifier senses the incoming preamble pulses and prevents the generation of the early and late signals when a preamble pulse is not present within a predetermined window of time.

DESCRIPTION OF THE DRAWING

FIG. 3 is a prior art illustration showing the data format for a 3480 high density tape storage sub-system;

FIG. 4 is a block diagram of the phase-locked loop control of the present invention incorporating a pattern qualifier; and FIGS. 5–6 illustrate the operation of the pattern qualifier of the present invention.

The present invention improves the phase detector 210 of the phase-locked loop control 60. The improved phase detector 210 is shown in FIG. 4. The data which is read from the tape 10 appears on bus 202 which is delivered into a delay circuit 400, an anticipator circuit 410, and a pattern qualifier 420. The delay circuit 400 delays the data by one-half of the normal data spacing or, in the preferred embodiment, by 257 nanoseconds. In FIG. 5, a normal 1.95 MHz series of "ones" is shown. At this frequency, the period for a single cycle is 514 nanoseconds as shown in FIG. 5. The delay circuit 400 conventionally delays the data on bus 202 by the required time.

Figure 1:
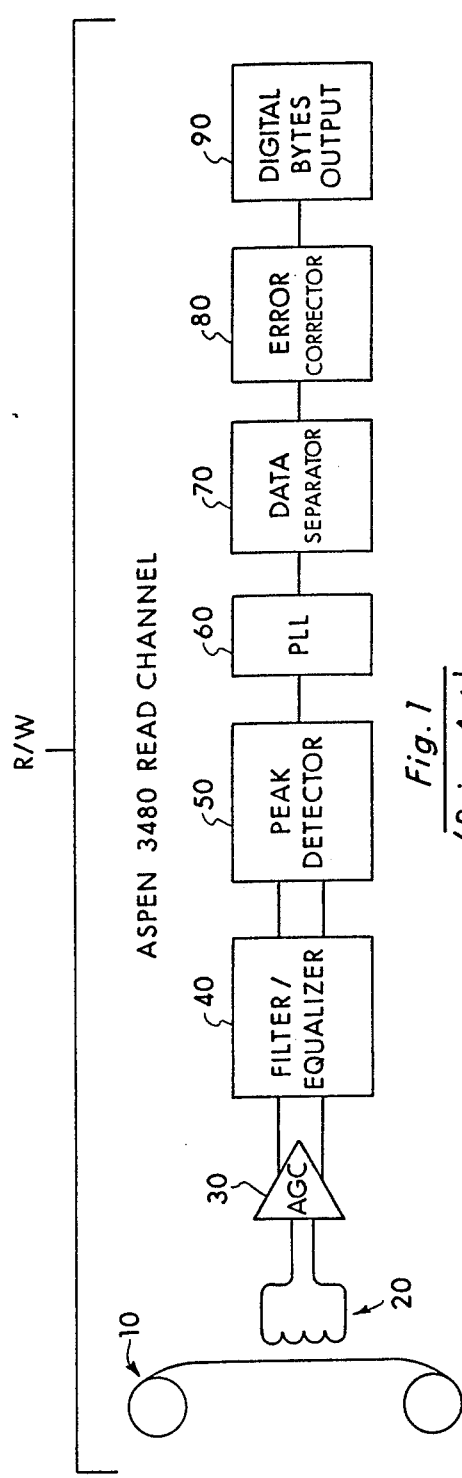
FIG. 1 is a prior art block diagram of a conventional 3480 tape read channel.
Figure 2:
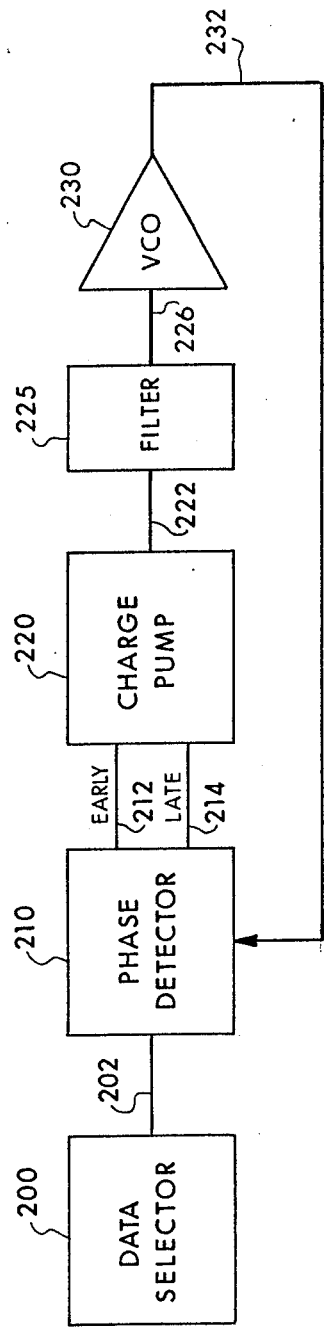
FIG. 2 is a prior art block diagram of a conventional phase-locked loop control.

The anticipator circuit 410 is also conventional and functions, during the low gain mode, to activate the phase correction enabler 430 to enable over line 432 the phase comparator 220. Hence, in the presence of a data "one" at the input to the anticipator circuit 410, the lead 412 becomes activated to activate phase correction enabler 430 to enable lead 432 to cause the phase comparator 220 to compare the delayed pulse on line 402 with the VCO clock pulse 232. Hence, the anticipator circuit enables the comparison to take place and the delay circuit 400 delays the pulse sufficiently to allow comparison to occur. This is a conventional operation when the acquisition mode over lead 434 is in low gain mode.

The present invention incorporates a pattern qualifier 420, for use during the high gain mode, in which to monitor for extra and missing preamble pulses. For example, in FIG. 6, preamble pulse 600 is missing. The pattern qualifier 420 of the present invention functions as follows. In FIG. 5, pulse 600 is properly being delivered on bus 202 and the pattern qualifier 420 of the present invention delivers a high signal on lead 422 which enables the phase correction enabler 430 to allow a phase comparison to occur. However, should the preamble pulse 600 be missing as shown in FIG. 6, then the signal on lead 422 is low and causes the phase correction enabler 430 not to deliver an enable signal on lead 432 thereby prohibiting the phase comparator 220 from functioning.

In this manner, the phase comparator 220 only operates to synchronize with the data during the presence of properly spaced "ones" in the preamble. In the event of errors, as shown by the missing pulse in FIG. 6, the phase comparator 220 is deactivated maintaining the VCO frequency until the next "one" pulse is received. If the frequency of the VCO 230 were not maintained as found under the teachings of the present invention loss of lock would occur during these defects.

The pattern qualifier 420 of the present invention monitors the spacing between the bits when the acquisition mode over lead 434 is in the high gain mode. For example in FIG. 5, spacing S is monitored for bits A and B by the pattern qualifier.

As shown in FIG. 6, if the spacing R is too long, the signal on lead 422 deactivates the phase correction enabler 430 from functioning. Under the teachings of the present invention, if R is greater than or equal to 1.5S, then the pattern qualifier 420 deactivates the phase correction enabler 430. In the preferred embodiment, therefore, for a period of 514 nanoseconds, R would equal 771 nanoseconds.

In FIG. 7, if the time "T" is too short, then the pattern qualifier 420 also disables the phase correction enabler 430. This is the case of an extra pulse being inserted into the preamble stream. Under the teachings of the preferred embodiment, if T is less than 0.5S, or 257 nanoseconds, then the phase correction enabler 430 is deactivated.

The pattern qualifier 420 functions on each "one" pulse in the preamble. If an error occurs, as shown in FIG. 6, the pattern qualifier 420 of the present invention disables the voltage controlled oscillator 230 from changing frequency. If an extra pulse as shown in FIG. 7 by pulse 700 occurs, again voltage controlled oscillator 230 is prevented from changing frequency. However, if all the "ones" are within the time frame properly expected by the pattern qualifier 420, then the phase-locked loop control 60 operates in a conventional fashion.

The operation of the pattern qualifier 420 can be stated in another fashion. If preamble pulse B in FIG. 5 occurs within a window W which is within the range of 0.5S to 1.5S, the phase comparator 220 is conventionally activated. If pulse B does not occur within this window reference, then the phase comparator 220 is deactivated. It is to be expressly understood that while the preferred embodiment utilizes a time frame of 0.5S to 1.5S, any suitable window W could be defined such as 0.75S to 1.25S, under the teachings of the present invention.

The pattern qualifier 420 is, in the preferred embodiment, implemented in a PAL (programmable array logic) device such as the type manufactured by Advanced Micro Devices, 901 Thompson Place, Sunnyvale, CA 94086 as Model No. 22V10 PAL. The PAL is programmed according to the following formulas set forth in Exhibit 1. In Exhibit 1, the symbol "/" means "NOT", the symbol "*" means "AND", and the symbol "+" means "OR." The following terms are defined:

A,B,C,D,E,F = The outputs of a binary counter
DTA = Input preamble on line 202
DTAD = Input pulse clocked in by 10 MHz clock
ONES = Output on line 422

The PAL functions as follows. When a pulse (DTA) such as A in FIG. 5 is clocked into the PAL as DTAD, the A through F counter commences to count according to the formula at the beginning of the DTAD pulse.

If, as shown in FIG. 5, the next pulse B is detected, the ONES output occurs. This indicates proper preamble DATA spacing. The counter resets and resumes a new count. If the count, however as shown in FIG. 6, exceeds a predetermined value (i.e., 1.5S), then the ONES output does not occur. If, however as shown in FIG. 7, the count is too low (i.e., 0.5S), before being reset by pulse B, then the ONES output does not occur.

The phase correction enabler 430 is essentially a logic circuit that is enabled when the acquisition mode is high on line 434, when the pattern qualifier 420 properly detects patterns as discussed above, and the anticipator circuit 410 senses the presence of a "one" bit to produce a high when a data bit is present. The anticipator circuit 410 only works during low gain mode.

While preferred embodiments of the present invention have been shown, it is to be expressly understood that modifications and changes may be made thereto and that the present invention is set forth in the following claims.

---

ONES QUALIFIER FOR PREAMBLE

CLK IS 10 MHZ
DATA INPUT IS PIN 2
ONES DETECTED IS PIN 21
BINARY COUNTER ARE OUTPUTS A THROUGH F
PINS:

| CLK | = 1 | DTA | = 2 | A | = 14 | B | = 15 |
|---|---|---|---|---|---|---|---|
| C | = 16 | D | = 17 | E | = 18 | F | = 19 |
| ONES | = 21 | DTAD | = 22; | | | | |

DEFINE INTERMEDIATE EQUATIONS:
RSTCNT = F*/E*D*/C*B*A;
EQUATIONS:

```
DTAD    =DTA;
A       =/A*/DTAD*/RSTCNT
B       =A*/B*/DTAD*/RSTCNT
        +/A*B*/DTAD*/RSTCNT;
C       =A*B*/C*/DTAD*/RSTCNT
        +C*/B*/DTAD*/RSTCNT
        +C*/A*/DTAD*/RSTCNT;
D       =A*B*C*/D*/DTAD*/RSTCNT
        +D*/C*/DTAD*/RSTCNT
        +D*/B*/DTAD*/RSTCNT
        +D*/A*/DTAD*/RSTCNT;
E       =A*B*C*D*/E*/DTAD*/RSTCNT
        +E*/D*/DTAD*/RSTCNT
        +E*/C*/DTAD*/RSTCNT
        +E*/B*/DTAD*/RSTCNT
        +E*/A*/DTAD*/RSTCNT;
F       =A*B*C*D*E/F*/DTAD*/RSTCNT
        +F*/E*/DTAD*/RSTCNT
        +F*/D*/DTAD*/RSTCNT
        +F*/C*/DTAD*/RSTCNT
        +F*/B*/DTAD*/RSTCNT
```

-continued

```
        +F*/A*/DTAD*/RSTCNT;
ONES :=/F*/E*/D*/C*B*A*DTAD
        +/F*/E*/D*C*/B*/A*DTAD
        +/F*/E*/D*C*/B*A*DTAD
        +/F*/E*/D*C*B*/A*DTAD
        +/F*/E*/D*C*B*A*DTAD
        +ONES*/DTAD*/RSTCNT
        +ONES*DTAD*/F*/E*/D*/C*/B*/A
        +ONES*DTAD*/F*/E*/D*/C*/B*A;
```

I claim:

1. A phase-locked loop control having a phase detector (210) receptive of a data preamble of all "ones" from a storage sub-system (10, 30, 40, 50, 200) for producing early and late signals applied to a voltage controlled oscillator (220, 225, 230) in order for the frequency of said oscillator to be synchronized with the frequency of said data preamble, said phase detector comprising:
   means receptive of said data preamble for preventing the generation of said early and late signals when a preamble pulse (600) is not present within a predetermined window (W) of time.

2. The phase-locked loop control of claim 1 wherein when the time between the start of one preamble pulse and the next is S, said window equals 0.5S to 1.5S.

3. A method for a phase-locked loop control having a phase detector (210) receptive of a data preamble of all "ones" from a storage sub-system (10, 30, 40, 50, 200) for producing early and late signals applied to a voltage controlled oscillator (220, 225, 230) in order for the frequency of said oscillator to be synchronized with the frequency of said data preamble, said method comprising the steps of:
   sensing the presence of said "ones" in said data preamble, and
   preventing the generation of said early and late signals when a preamble pulse (600) is not present within a predetermined window (W) of time.

4. The method of claim 3 wherein when the time between preamble the start of one preamble pulse and the next is S, said window equals 0.5S to 1.5S.

5. A method for phase-locked loop control having a phase detector (210) receptive of a data preamble of all "ones" from a 3480 cartridge tape system (10, 30, 40, 50, 200) for producing early and late signals applied to a voltage controlled oscillator (220, 225, 230) during a high gain mode in order for the frequency of said oscillator to be synchronized with the frequency of said data preamble, said method comprising the steps of:
   sensing the presence of said "ones" in said data preamble during the high gain mode, and
   preventing the generation of said early and late signals when a preamble pulse (600) due to an error occurs before a counter reaches a first value or after the counter reaches a second value.

* * * * *